(12) United States Patent
Shindo et al.

(10) Patent No.: US 7,083,745 B2
(45) Date of Patent: Aug. 1, 2006

(54) PRODUCTION METHOD FOR LAMINATE TYPE DIELECTRIC DEVICE AND ELECTRODE PASTE MATERIAL

(75) Inventors: Hitoshi Shindo, Nishio (JP); Atsuhiro Sumiya, Nishio (JP); Eturo Yasuda, Nishio (JP); Takashi Yamamoto, Chiryu (JP); Toshiatsu Nagaya, Kuwana (JP)

(73) Assignees: DENSO Corporation, Kariya (JP); Nippon Soken, Inc., Nishio (JP)

( * ) Notice: Subject to any disclaimer, the term of this patent is extended or adjusted under 35 U.S.C. 154(b) by 0 days.

(21) Appl. No.: 10/029,006

(22) Filed: Dec. 28, 2001

(65) Prior Publication Data

US 2002/0121329 A1 Sep. 5, 2002

(30) Foreign Application Priority Data

Dec. 28, 2000 (JP) .......................... 2000-400208
Nov. 22, 2001 (JP) .......................... 2001-358312

(51) Int. Cl.
*H01B 1/14* (2006.01)
*H01B 1/08* (2006.01)
*H01G 4/10* (2006.01)
*C04B 35/491* (2006.01)
*C04B 35/01* (2006.01)

(52) U.S. Cl. ............... 252/518.1; 252/512; 252/519.12; 252/519.51; 252/500; 252/62.3 R; 252/62.3 BT; 361/311; 361/321.2; 361/321.5

(58) Field of Classification Search .............. 252/518.1, 252/512, 511, 519.12, 519.51, 62.3 R, 62.3 BT, 252/500, 503, 506, 571, 520.2; 361/311, 361/321.2, 321.5
See application file for complete search history.

(56) References Cited

FOREIGN PATENT DOCUMENTS

| JP | 63-295491 | * 12/1988 |
|---|---|---|
| JP | 03-048415 | * 3/1991 |
| JP | 03-208831 | * 9/1991 |
| JP | 05-174612 | * 7/1993 |
| JP | 06-223621 | * 8/1994 |

* cited by examiner

*Primary Examiner*—Mark Kopec
*Assistant Examiner*—Kallambella Vijayakumar
(74) *Attorney, Agent, or Firm*—Nixon & Vanderhye P.C.

(57) ABSTRACT

This invention provides a method of producing a laminate type dielectric device free from peeling of an electrode layer and a ceramic layer and from voids in both electrode layer and ceramic layer, and an electrode paste material. The invention relates also to an electrode paste material for constituting electrode layers of a laminate type dielectric device produced by at least the steps of alternately laminating ceramic layers 11 containing a lead element as a constituent component and electrode layers 2, and degreasing and baking the laminate, wherein the electrode paste material contains CuO as a principal component of a starting material of an electrically conductive material, a solvent, a binder, and a cooperative material consisting of at least one kind of the main components constituting the ceramic layer 11.

8 Claims, 7 Drawing Sheets

PRODUCTION METHOD FOR LAMINATE TYPE DIELECTRIC DEVICE AND ELECTRODE PASTE MATERIAL

BACKGROUND OF THE INVENTION

1. Field of the Invention

This invention relates to production method for a laminate type dielectric device such as a laminate type capacitor, a laminate type piezoelectric actuator, etc., and an electrode paste material for forming electrode layers in the dielectric device.

2. Description of the Related Art

Laminate type dielectric devices produced by alternately laminating dielectric ceramic layers having various dielectric properties and electrode layers have been widely used in the past. Known electrode materials for forming these electrode layers include Pt, Pd, Ag, Ni, Cu, their mixtures and their alloys.

The problems encountered in producing the electrodes vary from electrode material to electrode material. Silver (Ag), for example, has a high electric conductivity and is relatively economical. However, Ag has a low melting point of 980° C., is likely to invite migration and therefore has low reliability.

In contrast, palladium (Pd) is expensive but has a high melting point. Pd has therefore been used in the form of an Ag—Pd metal material to suppress migration and to improve the melting point of the electrode material (refer to Japanese Unexamined Patent Publication (Kokai) No. 5-304043).

The addition of Pd can suppress migration, it is true, but bonding is not sufficient between the electrode material and a ceramic material. Various measures have been taken to cope with this problem as described in Japanese Unexamined Patent Publications (Kokai) Nos. 5-304043 and 8-255509.

Nickel (Ni) involves problems such as the occurrence of cracking and deformation and so-called "islanding" of the electrode due to superheating (rapid sintering of Ni at a temperature exceeding 1,000° C.). To cope with the problems, Japanese Unexamined Patent Publication (Kokai) No. 5-55077 proposes to mix Ni and NiO, and Japanese Unexamined Patent Publication (Kokai) No. 6-290985 proposes to add an oxide of a rare earth element.

Among them, the prior art technology using Ag aims at solving the problem that results from Ag, and the prior art technology using Ni, at solving the problem of superheating of Ni that is peculiar to Ni. However, these technologies for producing the electrode are expensive due to the expensive additives and the machining cost. So long as these materials are used, reduction of the production cost of the laminate type dielectric device that has widely been used will be difficult. Further, technologies in the case of Ag and Ni cannot be easily applied to Cu.

On the other hand, copper (Cu) could be a promising material among base metals as the economical electrode material. In connection with Cu-containing paste materials or electrodes, a technology is known that suppresses the occurrence of cracking resulting from oxidation expansion of Cu by mixing Cu and $Cu_2O$ at a suitable proportion (Japanese Unexamined Patent Publication (Kokai) No. 5-283274). Further, there are also known a method that forms a complex by using an organic phosphorus compound and a metal (Cu) ion, and baking the complex to assist sintering of ceramics and to make the film thickness uniform (Japanese Unexamined Patent Publication (Kokai) No. 5-242724), and a method that suppresses the occurrence of warp and cracking of the device by limiting the Cu content to 40 to 70 wt % to reduce the coating thickness (Japanese Unexamined Patent Publication (Kokai) No. 5-234414).

Still another known technology uses a paste material containing 40 to 60 wt % of Cu powder having a mean particle diameter of 0.5 to 2 μm and a particle size distribution of 0.3 to 4 μm and bakes the paste material to a film thickness of 1 to 3 μm so as (1) to suppress the occurrence of voids between the device and the electrode and inside the electrode, (2) to suppress the occurrence of breakage of the electrode resulting from warp of inner and outer electrodes, (3) to prevent deformation of a ceramic component itself and (4) to prevent inferior contact between the inner electrode and the outer electrode (Japanese Unexamined Patent Publication (Kokai) No. 5-190375). In this way, the methods and objects of using Cu electrodes are very diversified.

As an example relating to a Cu electrode or a Cu type paste material, Japanese Unexamined Patent Publication (Kokai) No. 5-275263 describes the addition of at least one kind of the principal components of the ceramic layer or a material having substantially the same composition as the ceramic layer (hereinafter called the "base" of the ceramic layer or the "cooperative material"). The cooperative material designated in this prior art reference needs a specific processing of adding inorganic powder the surface of which is coated with a metal of the same kind as metal powder of the electrode. The object of this technology is to inhibit sintering of the metal so as to prevent discontinuity of the electrode and the increase of the resistance. To solve the fundamental problem that sintering of Cu proceeds more quickly than sintering of the ceramic material, this reference attempts to retard sintering by impeding sintering of the metal and to avoid discontinuity of the electrode.

Another example of the addition of the cooperative material of the ceramic layer is described in Japanese Unexamined Patent Publication (Kokai) No. 64-89311. This technology relates to an internal electrode paste for a laminate ceramic body, and describes the addition of the same compound as the ceramic material of the ceramic body. However, the construction of the electrode paste material is not CuO, as used in the present invention as will be described later, but is $Cu_2O$.

In the case of the paste material consisting of CuO, large volume shrinkage occurs when CuO is reduced to metallic copper with the result of the occurrence of cracks in the sintered body, and de-lamination due to the occurrence of voids between the ceramic layer and the electrode layer. To solve this problem, the reference describes $Cu_2O$ as a substitution. The cooperative material of the ceramic layer is utilized to improve bondability between the inner electrode layer and the ceramic layer. In other words, this reference solves the problem of shrinkage of the Cu oxide in the electrode paste material by using $Cu_2O$ in place of CuO, and utilizes the cooperative material of the ceramic layer to improve bondability between the ceramic layer and the electrode layer.

Another example that uses the cooperative material of the ceramic layer is described in Japanese Unexamined Patent Publication (Kokai) No. 2-22806 that relates to a laminate ceramic capacitor.

In the case of this laminate ceramic capacitor, too, the reference describes that the cooperative material of the ceramic layer is to impart de-lamination resistance.

Examples of this reference use a copper paste (metal paste) but do not use CuO. The reference does not present the technical significance of the addition of the cooperative material of the ceramic layer.

Production of a laminate type dielectric device is not easy when the copper (metal) paste described in the Laid-Open Patent Publication described above is used.

For, the production process for producing the laminate by applying the paste material includes (1) degreasing, (2) metallizing, that is, a reducing step of the electrode material from CuO to Cu when the laminate is produced by using a CuO paste material, and (3) baking.

When the copper (metal) paste as the electrode paste material is used to produce the laminate, degreasing must be carried out in the reducing atmosphere to avoid peeling resulting from oxidation of copper (involving expansion). Degreasing is the step of dissolving and removing a binder, and the like, and when chemically expressed, it is the oxidation of carbon, and the like. Therefore, when degreasing is carried out in the reducing atmosphere, a longer processing time is necessary than degreasing in normal open air because the oxygen content is small.

Unless degreasing is sufficiently done, the remaining carbon reacts with oxygen and exerts adverse influences in the subsequent baking step in the reducing atmosphere. For example, because carbon is likely to remain at the center of the laminate, a difference in the atmosphere occurs between the outer peripheral portion and the center portion during reduction/baking even inside the same laminate type dielectric device, and the drop of displacement performance, or the like, partially develops with diffusion resulting from oxidation of the electrode or the reduction of the ceramic layer. On the other hand, complete degreasing is not practical because a longer time is necessary.

For the reasons described above, a paste material of copper oxide capable of being degreased even in the oxidizing atmosphere is advantageous as the electrode paste material for forming the electrode layers of the dielectric device produced by alternately laminating ceramic layers containing a lead element as the constituting component and the electrode layers.

As a matter of fact, when the CuO paste material is applied and laminated with the ceramic material, is then degreased, metallized (reduction of CuO of the electrode material to Cu) and baked, peeling does not occur between the electrode portions and the ceramic layers but voids develop in the electrode portions. When the CuO content in the CuO paste material is increased to solve this problem, the voids in the electrode portions can be eliminated and the continuous electrode layer can be formed, but voids develop in the ceramic layer.

SUMMARY OF THE INVENTION

In view of the problems of the prior art described above, the present invention aims at providing a production method of a laminate type dielectric device which is free from the occurrence of peeling between electrode layers and ceramic layers and free from the occurrence of voids in both electrode layers and ceramic layers, and an electrode paste material.

According to a first aspect of the present invention, there is provided an electrode paste material for forming electrode layers of a laminate type dielectric device produced by at least the steps of alternately laminating ceramic layers containing a lead element as a constituent component and electrode layers, degreasing and baking, wherein the electrode paste material contains CuO as the principal component of the starting material of an electrically conductive material, a solvent, a binder, and a cooperative material consisting of at least one of the principal components constituting the ceramic layers.

Next, the function and effect of this invention will be explained.

The electrode paste material of the present invention contains CuO as the principal component and the cooperative material as described above. Therefore, the CuO content in the electrode paste material can be easily adjusted.

In other words, when the cooperative material is not also contained, it is possible to obtain an electrode paste material free from the occurrence of voids and peel after baking and having an optimum CuO content. However, when the cooperative material is not contained, the electrode paste material quickly changes to the one that invites disadvantages such as voids and peeling if the CuO content deviates even slightly from the optimum CuO content. Therefore, adjustment of the CuO content is extremely difficult.

In contrast, the CuO content in the electrode paste material can be easily adjusted in the present invention because the electrode paste material contains the cooperative material as described above. In other words, the co-presence of the cooperative material can drastically enlarge the width of the optimum range of the CuO content, and can minimize the influences resulting from fluctuation of the CuO content.

Therefore, the electrode paste material having excellent quality can be adjusted, and when this electrode paste material is used, an excellent laminate type dielectric device free from the disadvantages such as cracks, voids and peeling can be easily produced.

Since this electrode paste material is mainly made of Cu as the electrically conductive material, the production cost becomes less than for the conventional electrode paste material using a precious metal for the electrode layer.

To obtain high performance in a laminate product obtained by using a ceramic material containing a Pb element as a constituent component and a Cu electrode material, it is necessary to sufficiently reduce the Cu electrode paste material and to form an electrode layer having high conductivity such as a Cu metal. Therefore, a processing in a reducing atmosphere becomes necessary.

On the other hand, when the ceramic material is reduced, melting occurs due to the eutectic reaction with Cu. Therefore, the reducing atmosphere must be adjusted to an atmosphere that does not reduce the ceramic material but reduces the Cu type material in the electrode paste material.

When the binder remains in the laminate product during the process step described above, carbon emitted from the binder reacts with oxygen and impedes adjustment of the atmosphere. When adjustment of the atmosphere is impeded, reduction of a part of the ceramic material occurs, and melting occurs due to the eutectic reaction with Cu.

Therefore, in the step of adjusting the reducing atmosphere, a sample that is sufficiently degreased (from which the binder is removed) is necessary.

If the eutectic reaction between the reduction product of a part of the ceramic material and Cu occurs belatedly (when the eutectic point is high), incomplete degreasing is permitted to a certain extent.

For example, when the eutectic point of the reduction product and Cu is higher than the highest temperature of the degreasing condition, degreasing is substantially conducted again at a temperature lower than the eutectic point in the subsequent process steps, and the binder that remains to a certain extent in the degreasing step can be thus evaporated without any problem.

On the other hand, when the ceramic material partly contains a Pb element as a constituent component, melting of Pb and Cu formed by the reduction occurs at a low eutectic point of 326° C. Therefore, degreasing must be completely terminated in the degreasing step.

To more completely attain degreasing, an atmosphere having sufficient oxygen becomes necessary because degreasing is oxidation of the binder.

To degrease the laminate product applied with the electrode paste material in the atmosphere having sufficient oxygen, expansion resulting from oxidation of the electrode material in the electrode paste material must be suppressed. To cope with this problem, an oxide such as CuO must be contained as one of the principal components of the paste material.

Further, the function when the cooperative material is contained will be explained in detail.

When the electrode paste material is applied to the green sheet for forming the ceramic layer and these members are laminated and integrally baked, sintering or a reaction occurs at three positions, that is, sintering of the ceramic layer, sintering of the electrode layer and sintering of their boundary portion. Among them, sintering of the boundary portion between the electrode layer and the ceramic layer is believed to occur most rapidly at a low temperature due to the reaction of the Cu electrode material or CuO existing as the oxide film of Cu oxide or $Cu_2O$ formed by partial reduction of CuO and the oxide contained in the ceramic layer at the eutectic point. Therefore, it is believed that peeling occurs with difficulty at this portion.

For this reason, the degree of progress of sintering of each of the electrode portion (electrode layer) and the ceramic layer and the degree of shrinkage of each member can be a problem. Generally, sintering of the electrode portion proceeds more quickly (at a higher rate) than that of the ceramic layer. Therefore, shrinkage (in a broader sense of the word inclusive of occurrence/extinction of voids due to evaporation of solvent and binder; hereinafter the same) of the electrode portion is greater than shrinkage of the ceramic layer, and voids are more likely to develop in the electrode portion. On the other hand, when the CuO content in the electrode paste material is increased, the electrode can be continuously formed without voids, but cracks (voids) develop in the ceramic layer. At this time, shrinkage due to sintering of the electrode portion becomes small, and the shrinkage ratio of the ceramic layer becomes relatively great.

A laminate product free from voids in both the electrode layer and the ceramic layer can be formed when the CuO content in the electrode CuO type paste material is adjusted to a suitable content. At this time, if the cooperative material of the ceramic layer is added in advance to the electrode CuO type paste material, a laminate product can be formed at the same CuO content, at which the laminate product free from voids in both electrode/ceramic layers can be formed without the addition of the cooperative material, and can be formed even when the CuO content is greater by several percents. In other words, a laminate product can be formed at a CuO content at which voids develop in the ceramic layer unless the cooperative material is added.

The phenomenon described above can be interpreted in the following way. When the cooperative material of the ceramic layer is added in advance to the electrode CuO type paste material, sintering is completed while the cooperative material of the ceramic layer added remains inside the electrode portion or in the boundary portion between the electrode portion and the ceramic layer, and a laminate product free from voids in both the electrode and the ceramic layers can be formed provided that the degree of progress of the electrode layer and its degree of shrinkage fit those of the ceramic layer. In other words, a laminate product can be formed at the same CuO content as the CuO content when the cooperative material of the ceramic layer is not added.

When the cooperative material of the ceramic layer is added to the paste material having a CuO content greater by several percents by weight than the CuO content of the case described above, the occurrence of voids in the ceramic layer can be suppressed because the cooperative material of the ceramic layer added into the electrode portion moves into the ceramic layer and adjusts the degree of shrinkage at a point of time when the degree of shrinkage of the ceramic layer becomes relatively great with the temperature rise, or within the temperature range near that point.

Next, a second aspect of the invention provides a method of producing a laminate type dielectric device by at least the steps of alternately laminating ceramic layers containing a lead element as a constituent component and electrode layers, and degreasing and baking the laminate, comprising preparing green sheets obtained by shaping a ceramic material into a sheet form, and an electrode paste material containing CuO as a principal component of a starting material of an electrically conductive material, a solvent, a binder, and a cooperative material consisting of at least one kind of the main components constituting the ceramic layer; applying the electrode paste material to at least one of the surfaces of the plurality of green sheets; and laminating the green sheets, and then conducting degreasing and baking.

It is noteworthy in this production method that the electrode paste material consisting of CuO as the principal component and containing the cooperative material is used.

When this electrode paste material is used, adjustment of CuO content becomes extremely easy as described above. Therefore, an excellent laminate type dielectric device free from peeling of the electrode layer and the ceramic layer and free from voids in both the electrode and the ceramic layers can be easily obtained.

Next, the application of the electrode paste material described above can be made to both surfaces of the green sheet, and the electrode paste material can be brought into mutual contact in the lamination step. In this case, the electrode paste material can be brought into mutual contact when the green sheets are laminated, and a quick reaction can be achieved in the subsequent baking process.

Further, a metallic foil having electrical conductivity can be interposed between the electrode paste materials. In this case, even when the component composition of the electrode paste material is such that the electrode layer is likely to disappear after baking, the metallic foil can reliably secure the conductive portion.

Next, the cooperative material described above preferably has substantially the same composition as that of the ceramic layer. Consequently, adhesion between the ceramic layer and the electrode layer can be further improved.

Further, the content of CuO is preferably greater than 30 wt % but less than 82.5 wt %, and the content of the cooperative material is greater than 0.5 wt % but is less than 25 wt %.

Preferably, the CuO content is not less than 40 wt % but not greater than 77.5 wt %.

The content of the cooperative material is preferably not less than 1 wt % but not greater than 15 wt %.

When the CuO content is not greater than 30 wt %, the problem occurs that voids develop in the electrode layer after baking. Therefore, the CuO content is more preferably 40 wt % or more. On the other hand, when the CuO content is 82.5 wt % or more, the problem develops that cracks (voids) develop in the ceramic layer. Therefore, the CuO content is more preferably not greater than 77.5 wt %.

When the content of the cooperative material is 25 wt % or more, the problem develops that the electrode layer is interrupted and becomes non-conductive. Therefore, the content of the cooperative material is more preferably not greater than 15 wt %.

When the content of the cooperative material is not greater than 0.5 wt %, the effect of suppressing cracks in the ceramic layer cannot be acquired. Therefore, the content of the cooperative material is more preferably at least 1 wt %.

Further, the ceramic layer can use PZT mainly made of an oxide having a $Pb(Zr, Ti)O_3$ type perovskite structure. This PZT exhibits extremely excellent properties as a dielectric.

Next, a third aspect of the invention provides an electrode paste material for constituting electrode layers of a laminate type dielectric device produced by at least the steps of alternately laminating ceramic layers containing a lead element as a constituent component and the electrode layers, and degreasing and baking the laminate, wherein the electrode paste material contains CuO and Cu as principal components of a starting material of an electrically conductive material, a solvent, a binder, and a cooperative material consisting of at least one kind of the main components constituting the ceramic layer.

In the present invention, a starting material of an electrically conductive material contains Cu in addition to CuO described above. Therefore, expansion resulting from expansion of oxidation of Cu in the degreasing step can be suppressed, and shrinkage of CuO due to its metallization in the reducing/baking steps can be suppressed, too.

Besides, the same function and effect as that of the first aspect of the invention can be obtained.

Next, a fourth aspect of the invention provides a method of producing a laminate type dielectric device by at least the steps of alternately laminating ceramic layers containing a lead element as a constituent component and electrode layers, and degreasing and baking the laminate, comprising preparing green sheets obtained by shaping a ceramic material into a sheet form, and an electrode paste material containing CuO and Cu as principal components of a starting material of an electrically conductive material, a solvent, a binder, and a cooperative material consisting of at least one kind of the main components constituting the ceramic layer; applying the electrode paste material to at least one of the surfaces of the plurality of green sheets; and laminating the green sheets, and then conducting degreasing and baking.

In this invention, too, a starting material of the electrically conductive material contains Cu in addition to CuO as the principal components. Therefore, expansion resulting from oxidation of Cu in the degreasing step can be suppressed, and shrinkage due to metallization of CuO in the reducing/baking steps is suppressed, too. A laminate type device can be produced without any problem if CuO is metallized before baking. However, if metallization when the baking is not sufficient, shrinkage takes place at a high temperature (during or after baking), and voids develops in the electrode layer. Because Cu and CuO are used as the principal components, the necessary amount of metallization is decreased, and the void occurrence ratio of the electrode layer can be easily suppressed.

Beside, the same function and effect as that of the second aspect of the invention can be obtained.

Next, the application of the electrode paste material can be made to both surfaces of the green sheet, and the electrode paste material can be brought into mutual contact in the lamination step. In this case, the electrode paste materials can be brought into mutual contact in the lamination step of the green sheets, and the quick reaction can be obtained in the subsequent baking step.

Further, a metallic foil having electrical conductivity can be interposed between the electrode paste materials. In this case, even when the component composition of the electrode paste material is such that the electrode layer is likely to disappear after baking, the metallic foil can reliably secure the conductive portion.

Preferably, the cooperative material described above has substantially the same composition as that of the ceramic layer. Consequently, adhesion between the ceramic layer and the electrode layer can be further improved.

Further, the total content of CuO and Cu is preferably greater than 30 wt % but less than 82.5 wt %, and the content of the cooperative material is greater than 0.5 wt % but is less than 25 wt %. However, the total content of CuO and Cu in the invention represents the amount calculated to CuO in terms of the proportion of the molecular weight.

Preferably, the total content of CuO and Cu is not less than 40 wt % but not greater than 77.5 wt %.

Further, the content of the cooperative material is preferably not less than 1 wt % but not greater than 15 wt %.

When the total content of CuO and Cu is not greater than 30 wt %, the problem occurs that voids develop in the electrode layer after baking. Therefore, the total content of CuO and Cu is more preferably at least 40 wt %. On the other hand, when the total content of CuO and Cu is 82.5 wt % or more, a problem occurs that cracks (voids) develop in the ceramic layer. Therefore, the total content of CuO and Cu is more preferably not greater than 77.5 wt %.

When the content of the cooperative material is not less than 25 wt %, the problem occurs that the electrode layer is interrupted and becomes non-conductive. Therefore, the content of the cooperative material is more preferably not greater 15 wt %.

When the content of the cooperative material is not greater than 0.5 wt %, the effect of suppressing cracks in the ceramic layer cannot be acquired. Therefore, the content of the cooperative material is more preferably at least 1 wt %.

Further, the ceramic layer can use PZT mainly made of an oxide having a $Pb(Zr, Ti)O_3$ type perovskite structure. This PZT exhibits extremely excellent properties as a dielectric.

DESCRIPTION OF THE PREFERRED EMBODIMENTS

Figure 1:
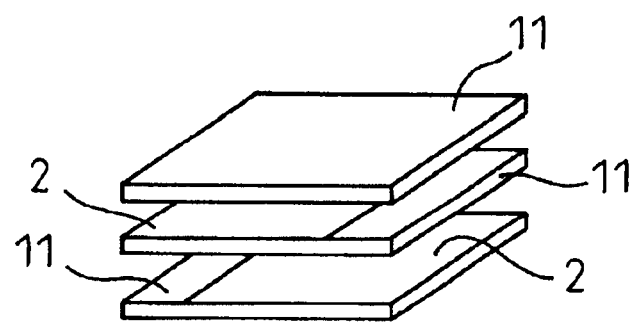
FIG. 1 is an explanatory view showing a production process of a laminate type dielectric device according to Embodiment 1.

Embodiment 1:

A production method of a laminate type dielectric device and an electrode paste material according to Embodiment 1 will be explained with reference to FIGS. 1 to 12.

In this embodiment, sixteen kinds of Samples 1 to 16 as electrode paste materials are first prepared as tabulated in Table 1.

TABLE 1

| Sample No. | Organic vehicle and resin | CuO powder | Cooperative material |
|---|---|---|---|
| 1 | 31.0 | 61.0 | 8.0 |
| 2 | 31.0 | 65.0 | 4.0 |
| 3 | 31.0 | 66.0 | 3.0 |
| 4 | 31.0 | 68.0 | 1.0 |
| 5 | 29.0 | 67.0 | 4.0 |
| 6 | 27.0 | 69.0 | 4.0 |
| 7 | 36.0 | 64.0 | nil |
| 8 | 35.0 | 65.0 | nil |
| 9 | 33.5 | 66.5 | nil |
| 10 | 31.0 | 69.0 | nil |
| 11 | 50.0 | 50.0 | nil |
| 12 | 44.0 | 50.0 | 6.0 |
| 13 | 40.0 | 50.0 | 10.0 |
| 14 | 19.5 | 77.5 | 3.0 |
| 15 | 14.5 | 82.5 | 3.0 |
| 16 | 17.5 | 82.5 | nil |
| 17 | 45.0 | 40.0 | 15.0 |
| 18 | 55.0 | 30.0 | 15.0 |
| 19 | 35.0 | 40.0 | 25.0 |
| 20 | 31.0 | 68.5 | 0.5 |

(wt %)

The electrode paste materials of Samples 1 to 6 all contain CuO as the principal component of a starting material of an electrical conductive material, a solvent, a binder and a cooperative material consisting of at least one kind of principal components of a ceramic material constituting the ceramic layer. The CuO content is within the range of 61 to 69 wt % and the content of the cooperative material is not greater than 8 wt %.

Samples 7 to 10 do not contain the cooperative material.

In Samples 11 to 13, the content of CuO is limited to 50 wt %. In Sample 11, the cooperative material is not added. In Samples 12 and 13, the cooperative material is added in different ratios.

Each Samples 14 to 16 has a high CuO content.

Additionally, Samples 1 to 13 use CuO powder having a mean particle diameter of 0.5 to 2 μm and Samples 14 to 16 use powder having a mean particle diameter of 8 μm.

More concretely, CuO powder (mean particle diameter: 0.5 to 2 μm or 8 μm) and the cooperative material consisting of the starting materials of the ceramic layer are blended and kneaded at blend ratios tabulated in Table 1 with an organic vehicle prepared by dissolving ethyl cellulose in terpineol and a resin agent (acrylic resin, arakyd resin, docell resin, etc) to prepare the paste materials having different CuO contents.

Next, a laminate type dielectric device is produced in the following way by using each of these electrode paste materials. In this embodiment, however, the number of lamination of the dielectric ceramic layers is 3 so that the section of the laminate type dielectric device can be easily observed.

First, a green sheet obtained by shaping the ceramic material into a sheet is produced by a doctor blade method.

Powders of lead oxide, zirconium oxide, titanium oxide, niobium oxide, strontium carbonate, etc, as the main starting materials of the dielectric ceramic layer are weighed so as to attain a desired composition. The lead content is weighed to be by about 1 to 2% richer than the stoichiometric ratio of the mixture composition in consideration of evaporation of lead. The mixture is dry mixed by using a mixer and is then calcined at 800 to 900° C. (lower than the baking temperature).

Pure water and a dispersant are added to the powder so calcined so as to form slurry. The resulting slurry is wet pulverized by using a pearl mill. After the pulverizate is dried and degreased, a solvent, a binder, a plasticiser, a dispersant, etc, are added and mixed by using a ball mill. The resulting slurry is vacuum de-foamed and its viscosity is adjusted while the slurry is being stirred by using a stirrer inside a vacuum apparatus.

Next, the slurry is shaped into a green sheet having a predetermined thickness by using a doctor blade.

After recovery, the green sheet is punched by using a puncher, or is cut by using a cutter, to give rectangular members having a predetermined size.

Next, the electrode paste material 2 of each of Sample 1 to 16 is screen-printed into a pattern to one of the surfaces of two green sheets 11 after shaping as shown in FIG. 1. In this embodiment, the printing thickness is 15 μm. The drawing shows an example of the green sheet 11 after printing of the pattern.

Another green sheet 11, to which the electrode paste material 2 is not printed, is added, and these three green sheets 11 are laminated as shown in the drawing in such a fashion that the electrode paste materials 2 alternately reach the right and left side surfaces.

After being bonded, the laminate product is cut into a predetermined size.

Next, the laminate product is heated in open air to 500° C. and is held for 5 hours for degreasing, and is then subjected to a metallizing process.

The metallizing process is the process that reduces CuO in the electrode paste material to Cu in a reducing atmosphere at a relatively low temperature. In this embodiment, since the ceramic material is the oxide containing lead at least from the aspect of the chemical formula, the reducing atmosphere is adjusted to a temperature immediately below 326° C. as the eutectic point of lead and copper, and reduction is carried out.

A baking process for integrally baking the laminate product is then carried out. The baking temperature can be changed depending on the kind of the ceramic materials constituting the dielectric ceramic layer, and is set to 950° C. in this embodiment. This adjustment atmosphere is set to the atmosphere in which oxidation of Cu is less and the oxide of the device portion is not reduced as much as possible. The reducing power is smaller than that of the metallizing process, and the oxygen partial pressure varies depending on the baking temperature. In this embodiment, the oxygen partial pressure is about $10^{-6}$ atm at 950° C.

A side electrode and an outer electrode are fitted depending on the kind of the product.

Figure 2:
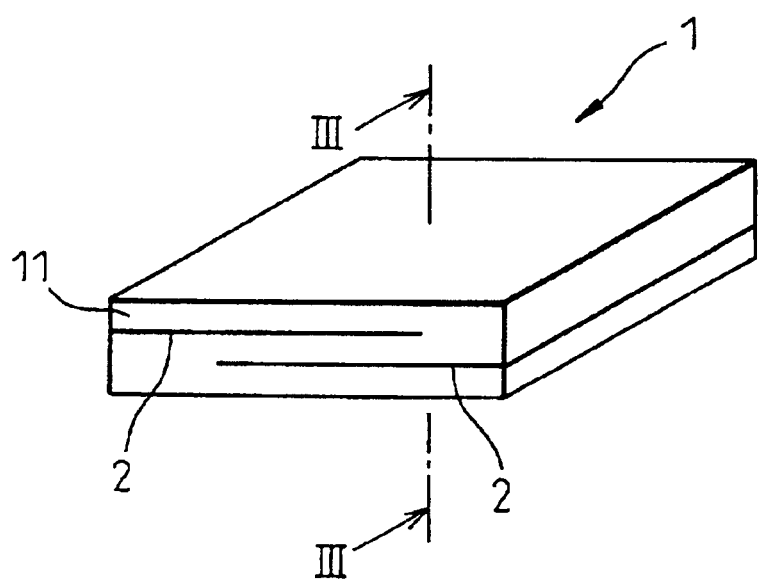
FIG. 2 is a perspective view showing the laminate type dielectric device in Embodiment 1.

The section of the laminate product (laminate type dielectric device 1) integrally baked as shown in FIG. 2 is observed in this embodiment. The observation position exists at the center of the section taken along a line III—III in FIG. 2.

FIGS. 3 to 12 represent schematic sketches of the observation results.

Figure 3:
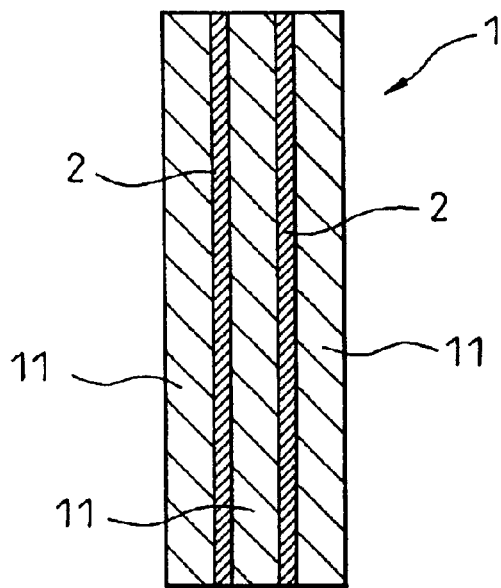
FIG. 3 is an explanatory view showing an observation result of a section of Sample 1 in Embodiment 1.
Figure 4:
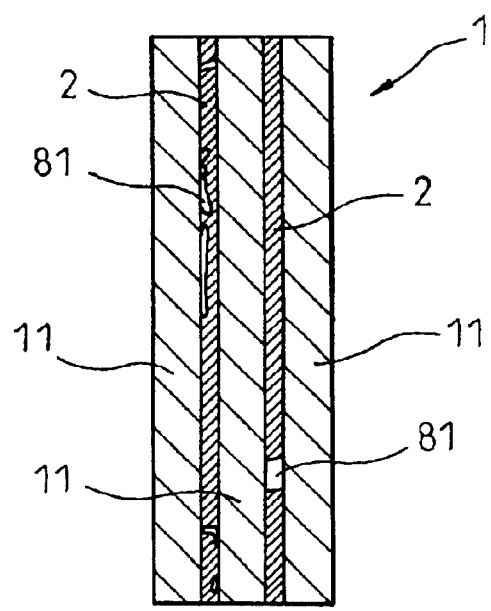
FIG. 4 is an explanatory view showing an observation result of a section of Sample 7 in Embodiment 1.

FIG. 3 shows the observation result of Sample 1. The results of Samples 2 to 6 are omitted because they as similar to the observation result of Sample 1. As shown in the drawing, Samples 1 to 6 do not have any voids and cracks in both electrode layer 2 and ceramic layer 11. No peeling develops at the boundary between them, and the bonding condition is excellent.

The following observation can be acquired. In Samples 1 to 4, the total addition amount of CuO powder and the cooperative material is fixed at 69 wt %, and the addition amount of the cooperative material is changed within the range of 1 to 8 wt % as tabulated in Table 1. The result is excellent even when the addition ratio of CuO and the cooperative material is changed within such a broad range. In Samples 2, 5 and 6, the addition amount of the cooperative material is fixed at 4 wt % and the content of CuO powder is changed within the range of 65 to 69 wt %. The result is excellent even when the addition ratio of CuO is changed within such a broad range.

On the other hand, Samples 7 to 10 do not contain the cooperative material as shown in FIGS. 4 to 7. In this case, voids 81 and cracks 82 are likely to develop.

Figure 5:
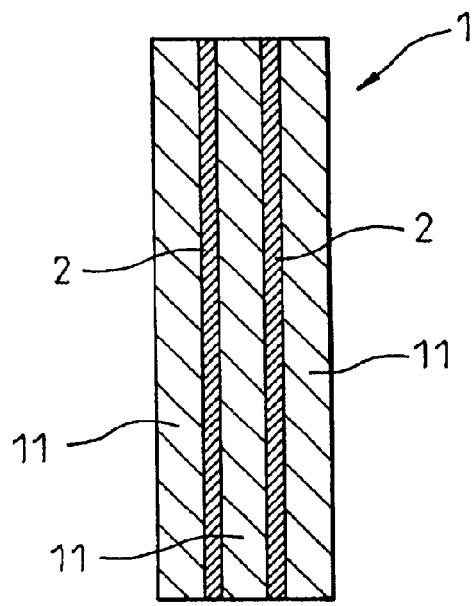
FIG. 5 is an explanatory view showing an observation result of a section of Sample 8 in Embodiment 1.
Figure 6:
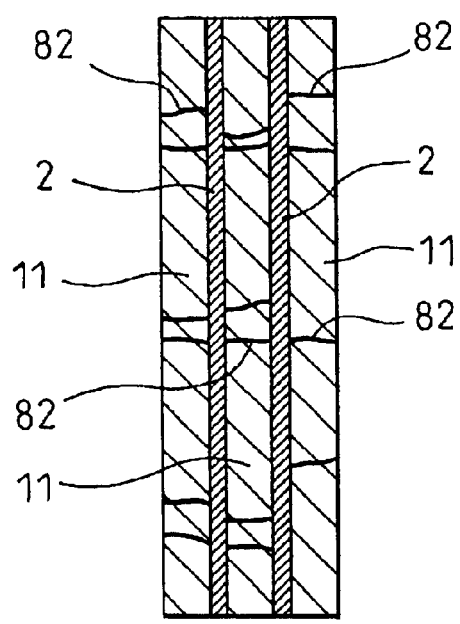
FIG. 6 is an explanatory view showing an observation result of a section of Sample 9 in Embodiment 1.
Figure 7:
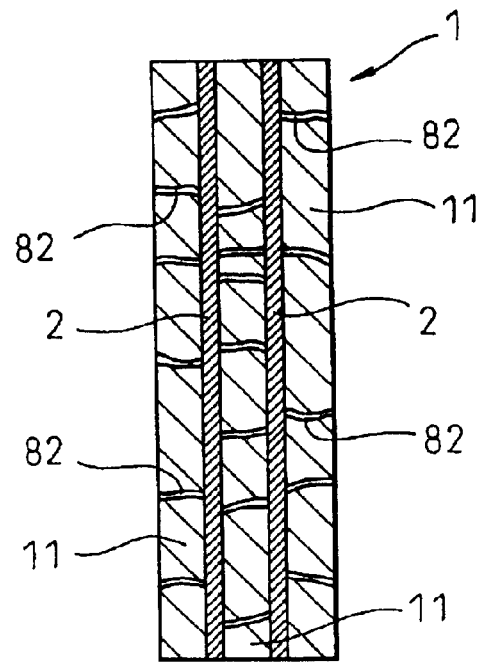
FIG. 7 is an explanatory view showing an observation result of a section of Sample 10 in Embodiment 1.

Sample 8 provides an excellent laminate type dielectric device even when the cooperative material is not added, as shown in FIG. 5. However, a disadvantage occurs when the CuO content changes even to a small extent. In other words, in the case of Sample 7 shown in FIG. 4, the voids 81 develop in the electrode layer 2 when the CuO content decreases by only 1 wt %, and in the case of Sample 9 shown in FIG. 6, the cracks 82 develop in the ceramic layer when the CuO content increases by only 1.5 wt %. When the CuO content increases by 4 wt % as in Sample 10, the occurrence of cracks 82 becomes greater as shown in FIG. 7.

It can be understood, from the comparison of Samples 1 to 6 with Samples 7 to 10, that, when the cooperative material is added, the laminate type dielectric device can be obtained under excellent conditions even when the changes in CuO content is greater than 4 wt %, but when the cooperative material is not added, adverse influences appear when the CuO content changes by only 1 wt %.

Figure 8A:
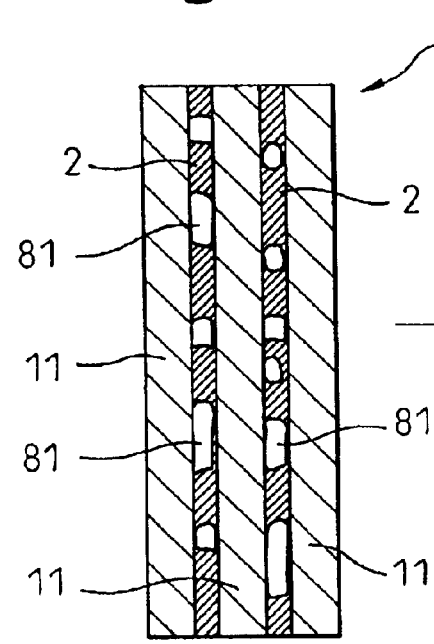
FIGS. 8(a) and 8(b) are explanatory views showing observation results of sections of Samples 11 and 12 in Embodiment 1, respectively.
Figure 8B:
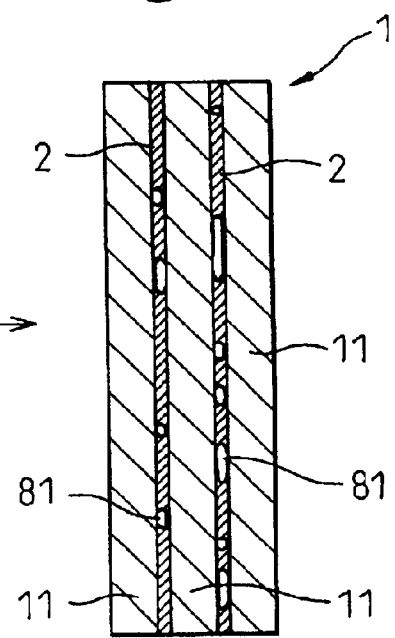
Figure 9:
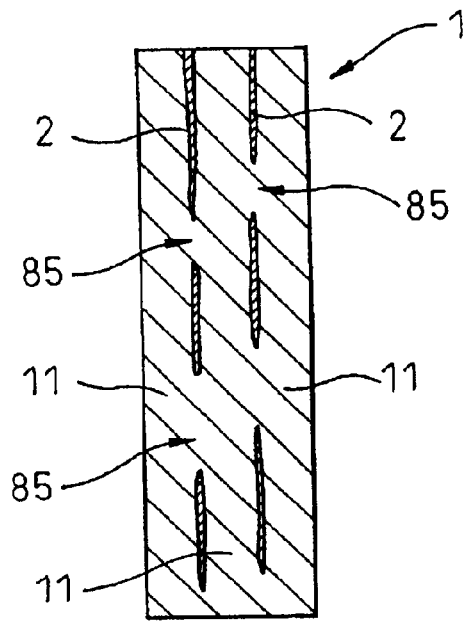
FIG. 9 is an explanatory view showing an observation result of a section of Sample 13 in Embodiment 1.

Next, in the case of Sample 11, the CuO content is decreased to 50 wt % and the cooperative material is not added. In this case, a large number of voids 81 can be observed as shown in FIG. 8(*a*). In contrast, in the case of Sample 12, the CuO content is 50 wt %, and 6 wt % of the cooperative material is added. In this case, the thickness of the electrode layer 2 becomes smaller than when the cooperative material is not added as shown in FIG. 8(*b*), so that the number of voids 81 decreases. However, when in the content of the cooperative material is further increased as in Sample 13, portions 85 at which the electrode layer 2 disappears occur as shown in FIG. 9.

This result represents that the problem cannot be solved by the mere addition of the cooperative material alone.

Next, Samples 14 and 15 respectively use the paste material prepared by mixing 3 wt % of the cooperative material, 19.5 wt % of the organic vehicle and the resin and 77.5 wt % of CuO powder (8 μm), and the paste material prepared by mixing 3 wt % of the cooperative material, 14.5 wt % of the organic vehicle and the resin and 82.5 wt % of CuO powder (8 μm) as tabulated in Table 1.

Figure 10:
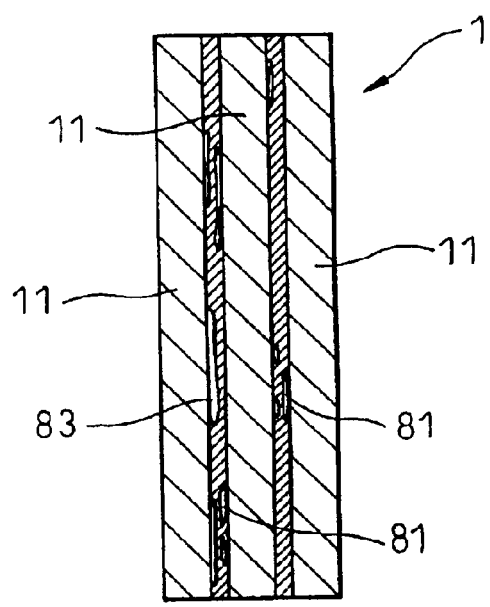
FIG. 10 is an explanatory view showing an observation result of a section of Sample 14 in Embodiment 1.
Figure 11:
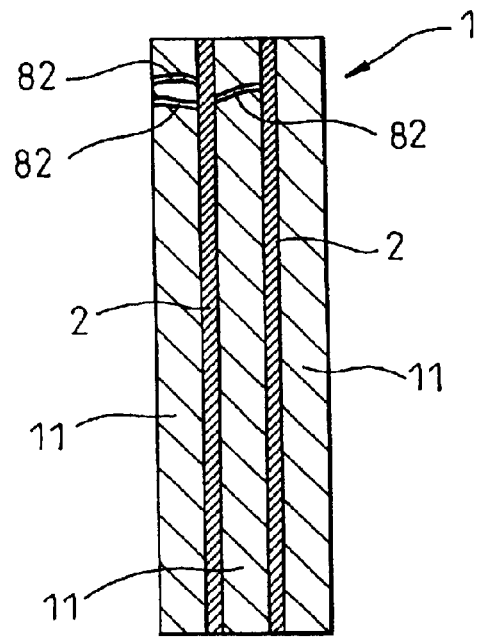
FIG. 11 is an explanatory view showing an observation result of a section of Sample 15 in Embodiment 1.

Large cracks are not observed in the ceramic layer 11 in Sample 14 as shown in FIG. 10. On the other hand, cracks 82 are partially observed in Sample 15. It can be estimated from this result that the CuO content of Sample 14 is the boundary of the CuO content at which the formation of voids in the electrode portion changes to the occurrence of cracks in the ceramic layer, that is observed due to the difference of the CuO content. In Sample 14, however, though the electrode portion is continuous and no cracking occurs in the ceramic layer, peeling 83 occurs at the boundary between the electrode portion and the ceramic layer as shown in FIG. 10.

Figure 12:
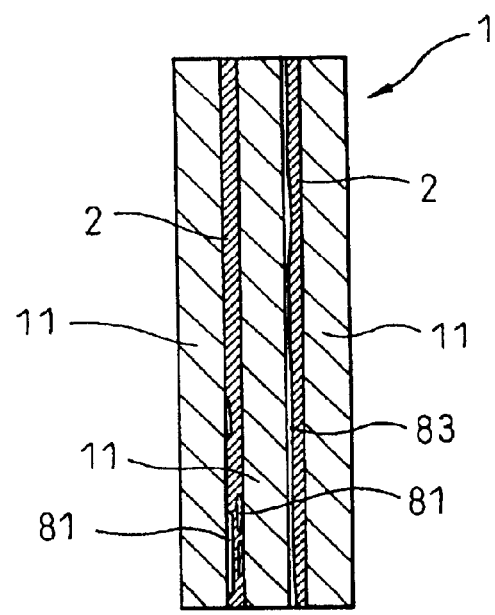
FIG. 12 is an explanatory view showing an observation result of a section of Sample 16 in Embodiment 1.

As shown in FIG. 12, further, enlarged peeling 83 occurs in the case of the electrode paste material of Sample 16 prepared by mixing 17.5 wt % of the organic vehicle and the resin and 82.5 wt % of CuO powder (8 μm) without adding the cooperative material.

Incidentally, the differences in Samples 1 to 3 are the particle diameter of CuO contained and the CuO content adjusted. Since the CuO content is adjusted so as to prevent the formation of voids in the electrode portion and the occurrence of cracks in the ceramic layer, the particle diameter is preferably less than 8 μm in the production process represented in this embodiment.

Embodiment 2:

This embodiment uses the materials of Sample 14 of Embodiment 1, i.e. [paste material prepared by mixing cooperative material: 3 wt %, organic vehicle and resin: 19.5 wt %, CuO powder (8 μm): 77.5 wt %], and produces a laminate type dielectric device in the same way as in Embodiment 1 with only the exception that the metallizing step is omitted. The observation result of the section conducted in the same way as in Embodiment 1 is shown as a schematic view in FIG. 13.

As can be seen from the drawing, peeling does not occur between the electrode layer and the ceramic layer, and the voids of the electrode portion can be restricted to a considerable extent. It can be concluded from the result of this embodiment that the problem of peel resulting from the difference of the particle diameters can be solved depending on the production process.

However, it can be estimated that when the particle diameter is extremely great in comparison with the thickness of the electrode layer, the electrode layer cannot be formed to a flat layer. Therefore, the limit condition of the particle diameter may well be such that it is not much greater than the thickness of the intended electrode layer.

It is estimated that peeling in Samples 14, 15 and 16 occurs for the following reasons. Though the reaction starting temperature between the electrode portion and the ceramic layer is low as in the prior art technology, the specific surface area of the electrode material decreases with the result that the reaction rate on the entire surface of the boundary between the ceramic layer and the electrode portion (the boundary surface to which printing is not made particularly) is retarded. To avoid peeling, therefore, it is possible to employ a method that brings the condition of the boundary portion between the ceramic layer having a slow sintering behavior and the electrode material into an easily bondable condition, and that utilizes the properties of the electrode material having high thermal conductivity and high reaction rate. For example, when the electrode material is printed on both surface of the ceramic layer and then lamination, degreasing, metallizing and baking are conducted, the members that come into mutual contact during lamination are only the electrode materials, and the reaction proceeds rapidly. On the other hand, the boundary portion between the electrode material and the ceramic layer keeps the contact state at the time of printing and is subjected to degreasing, metallizing and baking, and can be bonded relatively easily.

Embodiment 3:

This embodiment overcomes the problems (the occurrence of voids and peel) in the construction of the paste materials that cannot form both electrode layer and ceramic layer without voids and peel in Embodiment 1, by conducting printing a plurality of times.

The paste material comprises 45 wt % of the organic vehicle and the resin, 40 wt % of CuO (mean particle diameter: 0.5 to 2 μm) and 15 wt % of the cooperative material (Sample 17).

In Embodiments 1 and 2, drying is conducted at 80° C. for 10 minutes after printing. In this embodiment, after drying is conducted at 80° C. for 10 minutes, the electrode paste material is again applied, and drying is conducted at 100° C. for 20 minutes. The subsequent process steps are the same as those of Embodiments 1 and 2.

As a result, a laminate type dielectric device free from voids and peel in both electrode and ceramic layers can be obtained in the same way as in Sample 1 shown in FIG. 3.

In Samples 18 and 19 each having the construction listed below, application and drying are repeated a plurality of times in the same way as in Sample 17, but the occurrence of voids in the electrode layer or disappearance of the electrode layer, as shown in FIG. 9, is unavoidable.

Sample 18:
vehicle and resin: 55 wt %, CuO (mean particle diameter: 0.5 to 2 μm): 30 wt %, cooperative material: 15 wt %

Sample 19:
vehicle and resin: 35 wt %, CuO (mean particle diameter: 0.5 to 2 μm): 40 wt %, cooperative material: 25 wt %

Sample 18 has a smaller CuO content of 30 wt % in comparison with the CuO content 40 wt % of Sample 17. In other words, the lower limit of the CuO content is 30 to 40 wt %.

Sample 19 has a greater content of the cooperative material of 25 wt % than the content 15 wt % of Sample 17. In other words, the upper limit of the cooperative material is 15 to 25 wt %.

Embodiment 4:

This embodiment represents an example of a piezoelectric actuator 10 produced by using the electrode paste material shown in Embodiment 1.

Figure 14:
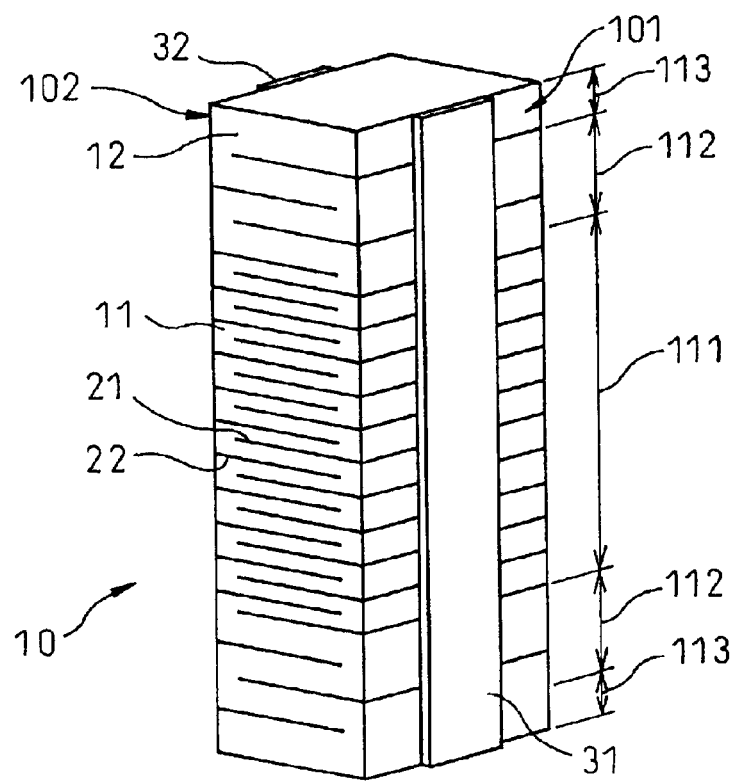
FIG. 14 is a perspective view showing a piezoelectric actuator according to Embodiment 3.

This piezoelectric actuator 10 is produced by alternately forming inner electrode layers (electrode layers) 21 and 22 to positive and negative between piezoelectric layers (ceramic layers) 11 as shown in FIG. 14. One 21 of the inner electrode layers is so disposed as to be exposed on one 101 of the side surfaces while the other inner electrode layer 22 is so disposed as to be exposed to the other side surface 102. Outer electrodes 31 and 32 are formed on the side surfaces 101 and 102 of the piezoelectric device 10 by baking silver in such a fashion as to electrically connect the end portions of the exposed inner electrode layers 21 and 22, respectively.

Baked silver that forms the outer electrodes 31 and 32 is the electrodes formed by baking an Ag paste, and has a composition consisting of Ag (97%) and a glass frit component (3%) as will be described later.

Outer electrodes are bonded respectively onto the outer electrodes 31 and 32 by using resin with silver (not shown in the drawing). Resin silver for bonding the outer electrodes has a composition consisting of 80% of Ag and 20% of an epoxy resin.

In the piezoelectric actuator 10, the center portion in the laminating direction is a driving portion 111, portions so arranged as to sandwich the driving portion are buffer portions 112 and portions so arranged as to further sandwich the buffer portions 112 are dummy portions 113.

It is noteworthy that the paste of Sample 2 of Embodiment 1 is used as the electrode paste material for forming the inner electrode layers 21 and 22. The piezoelectric actuator 10 obtained after baking is free from the voids and cracks in the ceramic layer and in the electrode layer, is also free from peeling between them, and has excellent quality.

However, the side electrode material is not limited to Ag, and any one of Cu, Pt, Ni and Pd may be contained.

Though this embodiment represents the piezoelectric actuator, a high quality product can also be obtained in a laminate type ceramic capacitor by using the excellent electrode paste material described above.

Embodiment 5:

In this embodiment, Sample 20 shown in Table 1 is prepared. In Sample 20, the total weight of CuO powder (mean particle diameter: 0.5 to 2 μm) and the cooperative material is kept constant at 69 wt % with 68.5 wt % of CuO powder and 0.5 wt % of the cooperative material. The section is observed for this Sample 20, too, in the same way as in Embodiment 1. As a result, the size and number of the cracks is similar to that of Sample 10 as shown in FIG. 7.

In other words, the improving effect cannot be observed even when about 0.5 wt % of the cooperative material is added. Therefore, it is preferred to add at least 0.5 wt % of the cooperative material.

Embodiment 6:

This embodiment represents the case where the electrode paste material contains not only CuO powder but also Cu powder.

In this embodiment, twenty kinds of samples (Samples 21 to 40) are prepared as shown in Table 2. In each sample, about a half of the amount of CuO powder in Samples 1 to 20 in Embodiments 1 and 5 is replaced by Cu powder.

The starting materials have the same properties as the materials constituting Samples 1 to 20.

Cu powder contained in Samples 21 to 33 and 37 to 40 is prepared by crushing Cu particles having a mean particle diameter of 0.5 μm before crushing into powder having a sheet form. Further, Cu particles having a mean particle diameter of 2.0 μm is used in Samples 34 to 36. The production condition of each sample is the same as that of Embodiment 1 with the exception of the metallizing step.

Whereas the metallizing condition is at immediately below 326° C. for 10 hours in Embodiment 1, it is immediately below 326° C. for 5 hours in this embodiment.

The section of each of the resulting three-layered laminate products (Samples 21 to 40) is observed in the same way as in Embodiment.

The observation results of Samples 21 to 26 are the same as that of Sample 1 shown in FIG. 3. As shown in the drawing, all the Samples 21 to 26 are free from voids and cracks in both electrode layer 2 and ceramic layer 11, and peel does not occur at their boundary portion. Thus, the excellent bonding condition can be obtained in all cases.

Here, the following observation can be made. In Samples 21 to 24, while the total addition amount of CuO powder, Cu powder and the cooperative material is kept fixed at 69 wt % as shown in Table 2 (the Cu powder amount is represented by a numeric value after conversion to the CuO amount by the ratio of the molecular weight; hereinafter the same), the addition amount of the cooperative material is changed within the range of 1 to 8 wt %. In other words, the addition proportion of CuO, Cu and the cooperative material is changed in a broad range. In Samples 22, 25 and 26, further, the addition amount of the cooperative material is kept fixed at 4 wt %, and the total amount of CuO powder and Cu powder is changed within the range of 65 to 69 wt % as shown in Table 2. Good results can be obtained when the addition proportion of CuO and Cu is changed in such a broad range.

On the other hand, Samples 27 to 30 of this embodiment do not contain the cooperative material in the same way as in Samples 7 to 10 (Embodiment 1) shown in FIGS. 4 to 7. In this case, voids 81 and cracks 82 are more likely to develop.

Sample 28 provides a good laminate type dielectric device even though it does not contain the cooperative material in the same way as Sample 8 (Embodiment 1) shown in FIG. 5, but when the total content of CuO and Cu changes even slightly from this sample, disadvantages occur. In other words, in the case of Sample 27, the voids 81 develop in the electrode layer 2 when the total content of CuO and Cu decreases by only 1 wt % (see FIG. 4). In Sample 29, the cracks 82 develop in the ceramic layer when the total content of CuO and Cu increases by only 1.5 wt % (see FIG. 6). when the total content of CuO and Cu increases by 4 wt % as in Sample 30, the occurrence of the cracks 82 becomes more remarkable in the same way as in FIG. 7.

It can be understood by comparing Samples 21 to 26 with Samples 27 to 30 that good laminate type dielectric devices can be obtained even when the change of the total content of CuO and Cu exceeds 4 wt % if the cooperative material is contained. However, when the cooperative material is not contained, the change of only 1 wt % of the total content of CuO and Cu exerts an adverse influence.

Next, Sample 31 represents the example where the total content of CuO and Cu is decreased to 50 wt % and the cooperative material is not added. In this case, a large number of voids 81 are seen occurring in the same way as the example shown in FIG. 8(*a*). In contrast, Sample 32 represents the example where the total content of CuO and Cu is 50 wt % and 6 wt % of the cooperative material is contained. In this case, the thickness of the electrode layer 2 becomes smaller than the electrode 2 without addition of the cooperative material in the same way as in the example shown in FIG. 8(*b*), so that the occurrence of voids 81 becomes less. When the content of the cooperative material is further increased as in Sample 33, however, the portions 85 where the electrode layer 2 disappears take place in the same way as in the example shown in FIG. 9.

These results represent that the problems cannot be solved by the mere addition of the cooperative material.

Next, Samples 34 and 35 respectively use the paste material prepared by mixing 3 wt % of the cooperative material, 19.5 wt % of the organic vehicle and the resin, 35 wt % of CuO powder (8 µm) and 42.5 wt %, calculated as CuO, of Cu powder (2 µm), and the paste material prepared by mixing 3 wt % of the cooperative material, 14.5 wt % of the organic vehicle and the resin, 40 wt % of CuO powder (8 µm) and 42.5 wt %, calculated as Cuo, of Cu powder (2 µm).

In Sample 34, large cracks are not observed in the ceramic layer 11 in the same way as in the example shown in FIG. 10. In Sample 35, on the other hand, cracks 82 are partly observed in the same way as in the example shown in FIG. 11. It can be estimated from this result that the total content of CuO and Cu of Sample 34 is near the boundary of the total content of CuO and Cu at which the formation of the voids in the electrode portion shifts to the occurrence of the cracks in the ceramic layer, that is observed in the change of the difference of the total content of CuO and Cu. In Sample 34, however, the electrode portion is continuous and the cracks do not occur in the ceramic layer, but peeling 83 develops at the boundary between the electrode portion and the ceramic layer as shown in FIG. 10.

In the case of the electrode paste material of Sample 36 that is prepared by mixing 17.5 wt % of the organic vehicle and the resin and 82.5 wt % of CuO powder and Cu powder in the amount calculated as the amount of CuO powder on the basis of the molecular weight, without the cooperative material, in the same way as the example shown in FIG. 12, too, greater peeling 83 occurs.

The differences from Samples 21 to 23 are the particle diameters of CuO and Cu and the total contents of CuO and Cu adjusted. Since the total content of CuO and Cu is adjusted so as to prevent the formation of voids in the electrode portion and the occurrence of cracks in the ceramic layer, the particle size in the production process of this embodiment is preferably less than 8 µm.

TABLE 2

| Sample No. | organic vehicle and resin | Cu powder (numeric value after conversion to CuO) | CuO powder | cooperative material |
|---|---|---|---|---|
| 21 | 31.0 | 31.0 | 30.0 | 8.0 |
| 22 | 31.0 | 33.0 | 32.0 | 4.0 |
| 23 | 31.0 | 36.0 | 30.0 | 3.0 |
| 24 | 31.0 | 37.0 | 31.0 | 1.0 |
| 25 | 29.0 | 34.0 | 33.0 | 4.0 |
| 26 | 27.0 | 38.0 | 31.0 | 4.0 |
| 27 | 36.0 | 34.0 | 30.0 | nil |
| 28 | 35.0 | 36.0 | 29.0 | nil |
| 29 | 33.5 | 34.5 | 32.0 | nil |
| 30 | 31.0 | 34.0 | 35.0 | nil |
| 31 | 50.0 | 25.0 | 25.0 | nil |
| 32 | 44.0 | 25.0 | 25.0 | 6.0 |
| 33 | 40.0 | 25.0 | 25.0 | 10.0 |
| 34 | 19.5 | 42.5 | 35.0 | 3.0 |
| 35 | 14.5 | 42.5 | 40.0 | 3.0 |
| 36 | 17.5 | 42.5 | 40.0 | nil |
| 37 | 45.0 | 20.0 | 20.0 | 15.0 |
| 38 | 55.0 | 11.0 | 19.0 | 15.0 |
| 39 | 35.0 | 20.0 | 20.0 | 25.0 |
| 40 | 31.0 | 37.5 | 31.0 | 0.5 |

(wt %)

Embodiment 7:

In this embodiment, a laminate type dielectric device is produced by using the material of Sample 34 of Embodiment 6 (paste material prepared by mixing 3 wt % of cooperative material, 19.5 wt % of organic vehicle and resin and 77.5 wt % of CuO powder and Cu powder) in the same way as in Embodiment 6 with the exception that only the metallizing step is omitted.

Figure 13:
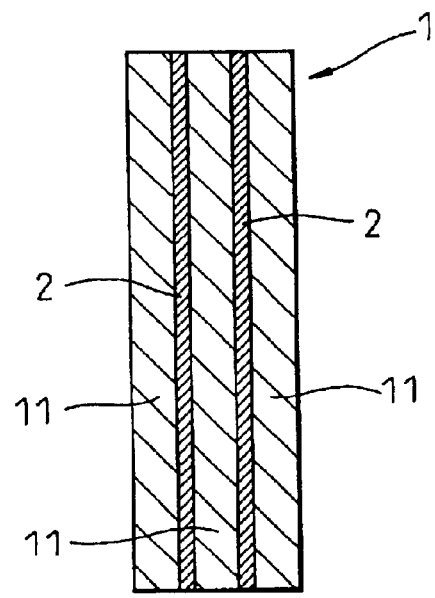
FIG. 13 is an explanatory view showing an observation result of a section of Sample 14 in Embodiment 2.

In the same way as in the example shown in FIG. 13, peeling is not observed between the electrode layer and the ceramic layer, and the voids of the electrode layer are restricted to a considerable extent. It can be concluded from the result of this embodiment that the problem of peeling resulting from the difference of the particle diameters can be solved depending on the production process.

However, it can be estimated that the electrode layer cannot be produced in a flat form if the particle diameter is much greater than the thickness of the electrode layer. Therefore, it will be sufficient that the particle diameter is not much greater than the intended electrode layer as the limiting condition of the particle diameter.

Peeling in Samples 34, 35 and 36 presumably occurs because the specific surface area of the electrode material drops though the reaction starting temperature between the electrode portion and the ceramic layer remains low in the same way as in the prior art technologies, and promotion of the reaction on the entire boundary surface between the ceramic layer and the electrode layer (particularly, the boundary surface that is not printed) is retarded. Therefore, to avoid peeling, it is possible to use a method that brings in advance the boundary portion between the ceramic layer having a low sintering behavior and the electrode material into an easily bondable condition, and utilizes the properties of the electrode materials having high conductivity and a high reaction rate. For example, when the electrode material is in advance printed and laminated on both surfaces of the ceramic layer and thereafter degreasing, metallizing and baking are conducted, it is the printed electrode materials that come into mutual contact at the time of lamination, and the reaction rapidly proceeds at the time of heating. On the other hand, one side of the boundary portion between the electrode material and the ceramic layer is relatively easily bondable because degreasing, metallizing and baking are conducted while the contact condition at the time of printing is kept as such.

Embodiment 8:

This embodiment solves the problems (occurrence of voids and peeling) by use of the construction of the paste material, which cannot form both electrode and ceramic layers without inviting voids and peel in Embodiment 6, by conducting printing a plurality of times.

The base material consists of 45 wt % of the organic vehicle and the resin, 40 wt % of CuO and Cu and 15 wt % of the cooperative material (Sample 37).

In Embodiments 6 and 7, drying is conducted at 80° C. for 10 minutes after printing. In this embodiment, after drying is conducted at 80° C. for 10 minutes, the electrode paste material is again applied, and drying is conducted at 100° C. for 20 minutes. The subsequent process steps are the same as those of Embodiments 5 and 6.

As a result, this embodiment can obtain a laminate type dielectric device free from voids and peel in both electrode and ceramic layers in the same way as Sample 1 shown in FIG. 3.

In Samples 38 and 39 each having the construction listed below, application of the paste material and drying are carried out a plurality of times in the same way as Sample 37, but the occurrence of voids in the electrode layer or disappearance of the electrode layer (interruption; the same as in FIG. 9) cannot be avoided.

Sample 38:
  organic vehicle and resin: 55 wt %, CuO and
  Cu: 30 wt %, cooperative material: 15 wt %
Sample 39:
  organic vehicle and resin: 35 wt %, CuO and
  Cu: 40 wt %, cooperative material: 25 wt %

In comparison with Sample 37, Sample 38 has smaller Cu and CuO contents, that is, 30 wt %, with respect to 40 wt % of the former. In other words, the lower limit of the Cu and CuO contents is 30 to 40 wt %.

In comparison with Sample 37, Sample 39 has a greater content of the cooperative material, that is, 25 wt %, with respect to 15 wt % of the former. In other words, the upper limit of the cooperative material is 15 to 25 wt %.

Embodiment 9:

In this embodiment, the section of Sample 40 shown in Table 2 is observed in the same way as in Embodiment 6. In Sample 40, the total weight of CuO powder, Cu powder and the cooperative material is kept constant at 69 wt % in the same way as Samples 21 to 24 in Embodiment 6, and the content of CuO powder and Cu powder is set to 68.5 wt % and the cooperative material, to 0.5 wt %. As a result of observation of the section of this Sample 40, the size and number of cracks are the same as those of Sample 10 as shown in FIG. 7.

In other words, even when both CuO powder and Cu powder are contained, the improving effect cannot be recognized when about 0.5 wt % of the cooperative material is added. It is therefore preferred to add at least 0.5 wt % of the cooperative material.

What is claimed is:

1. An electrode paste material for constituting electrode layers of a laminate dielectric device produced by at least the steps of alternately laminating ceramic layers containing lead as a constituent component and the electrode layers, and degreasing and baking the laminate, wherein said electrode paste material contains CuO as a principal component of a starting material of an electrically conductive material mainly, a solvent, a binder, and a cooperative material made of an oxide having a $Pb(Zr,Ti)O_3$ perovskite structure as said ceramic layer.

2. An electrode paste material according to claim 1, wherein the content of said cooperative material is not less than 1 wt% but not greater than 15 wt%.

3. An electrode paste material for constituting electrode layers of a laminate dielectric device produced by at least the steps of alternately laminating ceramic layers mainly made of an oxide having a $Pb(Zr,TI))_3$ perovskite structure and the electrode layers, and degreasing and baking the laminate, wherein said electrode paste material contains CuO and Cu as principal components of a starting material of an electrically conductive material, a solvent, a binder, and a cooperative material consisting of an oxide having a $Pb(Zr,Ti)O_3$ perovskite structure, wherein the total content of CuO and Cu is not less than 40 wt % but not greater than 77.5 wt % calculated to CuO in terms of the ratio of the molecular weight.

4. An electrode paste material according to claim 3, wherein the content of said cooperative material is not less than 1 wt % but not greater than 15 wt %.

5. An electrode paste material for constituting electrode layers of a laminate dielectric device produced by at least the steps of alternately laminating ceramic layers containing lead as a constituent component and the electrode layers, and degreasing and baking the laminate, wherein said electrode paste material contains CuO as a principal component of a starting material of an electrically conductive material, a solvent, a binder, and a cooperative material mainly made of an oxide having a $PB(Zr,Ti)O_3$ perovskite structure as ceramic layer, wherein the content of CuO is not less than 40 wt% but not greater than 77.5 wt % and the content of said cooperative material is greater than 0.5 wt % but less than 25 wt %.

6. An electrode paste material according to claim 5, wherein the content of said cooperative material is not less than 1 wt % but not greater than 15 wt %.

7. An electrode paste material for constituting electrode layers of a laminate dielectric device produced by at least the steps of alternately laminating ceramic layers mainly made of an oxide having a $Pb(Zr,Ti)O_3$ perovskite structure and the electrode layers, and degreasing and baking the laminate, wherein said electrode paste material contains CuO and Cu as principal components of a starting material of an electrically conductive material, a solvent, a binder, and a cooperative material having substantially the same composition as said ceramic layer, wherein the total content of CuO and Cu is greater than 30 wt % but less than 82.5 wt % calculated to CuO in terms of the ratio of the molecular weight, and the content of said cooperative material is greater than 0.5 wt % but less than 25 wt %.

8. An electrode paste material according to claim 7, wherein the content of said cooperative material is not less than 1 wt % but not greater than 15 wt %.

* * * * *